(12) United States Patent
Sabatini et al.

(10) Patent No.: US 10,611,199 B2
(45) Date of Patent: *Apr. 7, 2020

(54) TYRE SENSOR DEVICE WITH FLEXIBLE PRINTED CIRCUIT BOARD

(71) Applicant: PIRELLI TYRE S.P.A., Milan (IT)

(72) Inventors: Marco Sabatini, Milan (IT); Alberto Botta', Les Charbonnieres (CH); Gaetan Boulard, Les Charbonnieres (CH)

(73) Assignee: PIRELLI TYRE S.P.A., Milan (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/420,109

(22) Filed: May 22, 2019

(65) Prior Publication Data

US 2019/0322143 A1    Oct. 24, 2019

Related U.S. Application Data

(63) Continuation of application No. 15/125,566, filed as application No. PCT/EP2015/056424 on Mar. 25, 2015, now Pat. No. 10,369,852.

(30) Foreign Application Priority Data

Mar. 28, 2014   (IT) .............................. MI2014A0532

(51) Int. Cl.
*B60C 23/04* (2006.01)
*H05K 1/18* (2006.01)
(Continued)

(52) U.S. Cl.
CPC ........ *B60C 23/0493* (2013.01); *B60C 23/041* (2013.01); *B60C 23/0447* (2013.01); *B60C 23/0461* (2013.01); *B60C 23/20* (2013.01); *H05K 1/144* (2013.01); *H05K 1/148* (2013.01); *H05K 1/189* (2013.01); *H05K 5/0026* (2013.01);
(Continued)

(58) Field of Classification Search
CPC ... G01L 17/00; G01L 17/005; G01L 19/0645; G01L 19/147; G01L 1/16; G01L 1/18; G01L 9/008; G01L 9/0098; G01M 17/02; G01M 17/021; G01M 17/022; G01M 17/027; G01M 17/025; G01M 17/024; G01M 17/10; G01M 7/08; G01M 17/0076; G01M 17/013; G01M 17/03; G01M 17/04; G01M 17/06; G01M 17/08; G01M 1/02; G01M 1/045; G01M 1/12; G01M 1/225;
(Continued)

(56) References Cited

U.S. PATENT DOCUMENTS 10,369,852 B2 *   8/2019   Sabatini ................. H05K 1/189

* cited by examiner

*Primary Examiner* — Andre J Allen
(74) *Attorney, Agent, or Firm* — Steinfl + Bruno, LLP

(57) ABSTRACT

A tyre sensor device having a container with a container housing and a tyre sensor device electronics assembly, the tyre sensor device electronics assembly including a foldable flexible printed circuit board with at least two printed circuit board portions each having two surfaces and being suitable for placement of electronic components of the tyre sensor device. The electronic components have at least one sensor for sensing at least one tyre parameter. The foldable flexible printed circuit board is configured to be folded for insertion of the tyre sensor device electronics assembly in the container housing. The container housing is adapted to contain the foldable printed circuit board in a folded condition.

10 Claims, 9 Drawing Sheets

(51) Int. Cl.
    *B60C 23/20*     (2006.01)
    *H05K 1/14*      (2006.01)
    *H05K 5/00*      (2006.01)
    *H05K 5/02*      (2006.01)

(52) U.S. Cl.
    CPC ..... *H05K 5/0247* (2013.01); *H05K 2201/042* (2013.01); *H05K 2201/055* (2013.01); *H05K 2201/10151* (2013.01)

(58) Field of Classification Search
    CPC ........ G01M 3/04; G01M 3/40; G01M 5/0091; G01M 7/02; G01M 99/00; G01M 99/002
    USPC ................................................ 73/146–146.8
    See application file for complete search history.

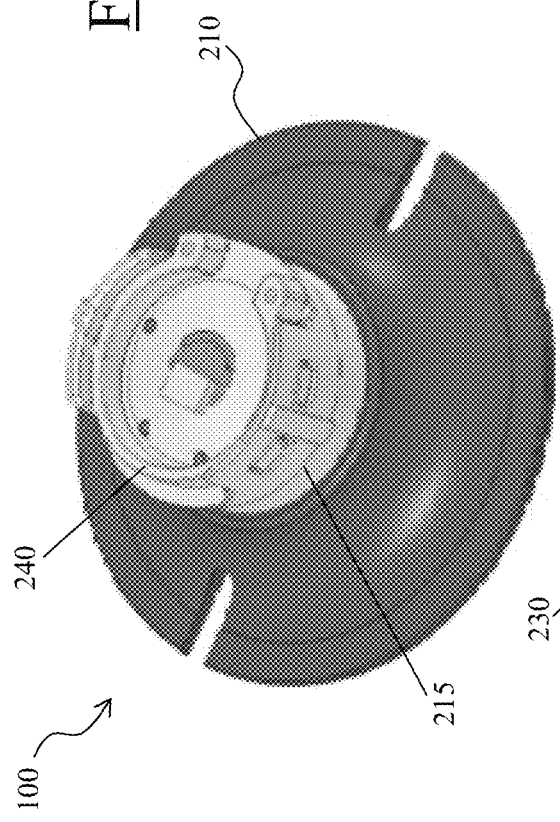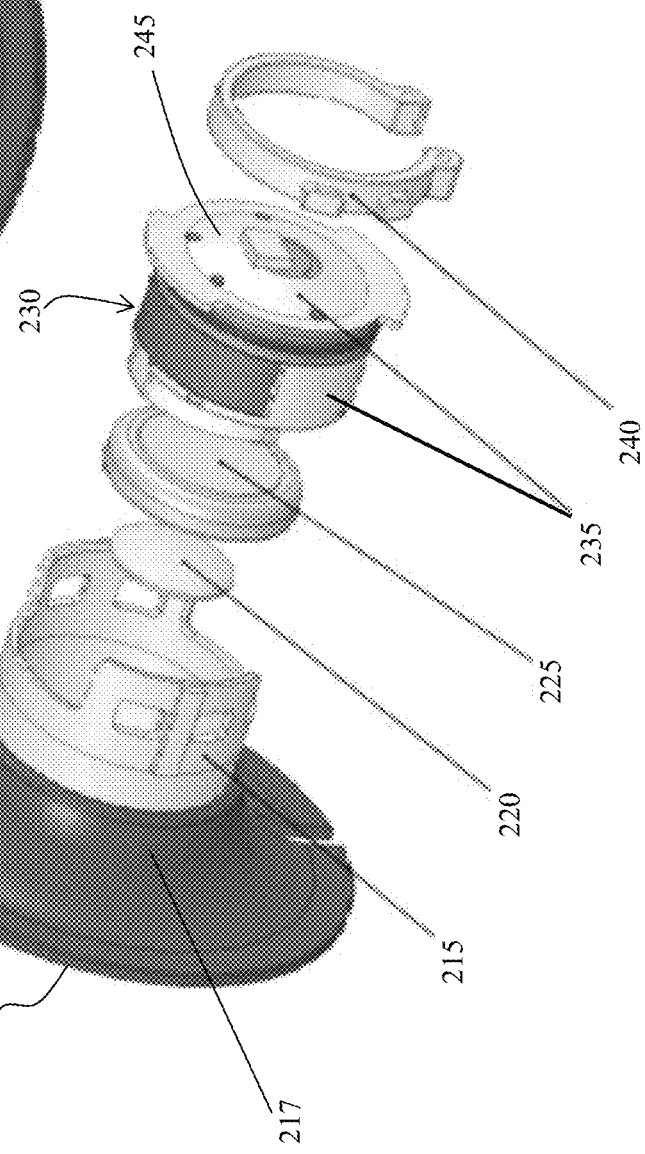

TYRE SENSOR DEVICE WITH FLEXIBLE PRINTED CIRCUIT BOARD

CROSS REFERENCE TO RELATED APPLICATIONS

The present application is a continuation application of U.S. application Ser. No. 15/125,566 filed on Sep. 12, 2016 which is the U.S. National Stage of International Patent Application No. PCT/EP2015/056424 filed on Mar. 25, 2015 which, in turn, claims priority to Italian Application No. MI2014A000532 filed on Mar. 28, 2014, the contents of each of which are incorporated herein by reference in their entirety.

BACKGROUND OF THE INVENTION

Field of the Invention

The present invention relates to the field of sensors for vehicle tyres, and particularly to a tyre sensor device.

Overview of the Related Art

The incorporation of electronic devices within pneumatic tyres is taking a greater importance in order to increase the safety of vehicles. Tyre electronics may include sensors and other components suitable for obtaining information regarding the behavior of a tyre, as well as various physical parameters thereof, such as for example temperature, pressure, number of tyre revolutions, vehicle speed, etc.

Such information may become useful in tyre monitoring and/or alarm systems.

Furthermore, active control/safety systems of the vehicle may be based on information sent from sensor devices provided in the tyres.

Active safety systems use information about the external environment of a vehicle to change the vehicle behavior in pre-crash time period or during the crash event, with the ultimate goal of avoiding a crash altogether. Initially, active safety systems were primarily focused on improving the vehicle longitudinal motion dynamics, in particular, on more effective braking Anti-lock Braking Systems (ABS) and Traction Control (TC) systems. TC systems prevent the wheel from slipping while improving vehicle stability and steerability by maximizing the tractive and lateral forces between the vehicle's tyre and the road. These systems were followed by more powerful vehicle stability control systems, e.g., Electronic Stability Program (ESP), Vehicle Stability Control (VSC), and Dynamic Stability Control (DSC). These latter systems use both brakes and engine torque to stabilize the vehicle in extreme handling situations by controlling the yaw motion. Active suspension systems are also an important part in vehicle active safety systems. They have been traditionally designed by trading-off three conflicting criteria: road holding, load carrying and passenger comfort. The suspension system has to support the vehicle, provide directional control during handling manoeuvres and provide effective isolation of passengers/payload from road disturbances.

The active safety control systems described above are based upon the estimation of vehicle dynamics variables such as forces, load transfer, tire-road friction. The more accurate and "real time" the parameter estimation, the better the overall performance of the control system. Currently, most of these variables are indirectly estimated using on-board sensors, and are not very accurate. Using measurements made by sensors fitted on the vehicle tyres would provide far more accurate estimation of the parameters relevant to the vehicle dynamics.

SUMMARY OF THE INVENTION

Setting up a system based on sensors fitted on vehicle tyres is however a challenging task, for several reasons. In particular, the tyre sensor device should have limited dimensions and/or weight, in order to limit or possibly avoid unbalance of the tyre during rotation. However, complex tyre sensors adapted to provide detailed information to a vehicle control system related to the behavior of the tyres during running of a vehicle need a number of electronics and/or sensing components which have to be provided. Such plurality of components can reach a number of a hundred or more and need space to be properly located. This goes against the requirement of having a tyre sensor device being sufficiently small in dimensions.

The inventors have found that a very compact tyre sensor device can be accomplished by exploiting a flexible printed circuit board. In particular, the flexible printed circuit board can host a high number of components and be folded in order to limit the occupied space.

According to an aspect of the present invention, a tyre sensor device is provided, comprising a connecting element for connecting the tyre sensor device to a vehicle tyre, and a tyre sensor device electronics assembly housed in the connecting element.

According to another aspect of the present invention, a vehicle tyre comprising an inner liner is provided, wherein a tyre sensor device is connected to said inner liner through a connecting element, said tyre sensor device comprising a tyre sensor device electronics assembly housed in the connecting element.

Preferred aspects of the present invention are described hereinbelow.

The tyre sensor device electronics assembly comprises a flexible printed circuit board being foldable and comprising at least two printed circuit board portions, each having two surfaces, the at least two printed circuit board portions being suitable for the placement, on at least one surface thereof, of electronic components of the tyre sensor device, wherein said electronic components comprise at least one sensor for sensing at least one tyre parameter. The flexible printed circuit board is folded so that the tyre sensor device electronics assembly can be inserted in the connecting element with the at least two printed circuit board portions being essentially planar.

Preferably, the flexible printed circuit board is folded such that the at least two essentially planar printed circuit board portions lie on substantially vertically stacked planes.

The connecting element may comprise a rubber housing adapted to be attached to an inner liner of the tyre. The rubber housing preferably has a seat for receiving a container having a cavity for accommodating the tyre sensor device electronics assembly.

Preferably, the tyre sensor device comprises a housing, accommodated in said container and adapted to contain the folded printed circuit board.

Said housing may comprise a first housing part and a second housing part joinable to each other, and a cap that closes from above the housing.

Preferably, the flexible printed circuit board is foldable to a generic "S" or "Z" shape and, when folded, it comprises three essentially planar portions suitable for the placement, on at least one surface thereof, of electronic components of the tyre sensor device.

The flexible printed circuit board may comprise two joining portions for joining the three essentially planar portions, said joining portions ensuring flexural mechanical connection between the essentially planar portions and electrical connection among the electronic components placed on the essentially planar portions.

In embodiments of the present invention, the flexible printed circuit board has three conductive layers for signals and one conductive layer for a ground potential in the three essentially planar portions, and one conductive layer for the signals and one conductive layer for the ground potential in the joining portions.

The tyre sensor device may advantageously comprise a transmitting antenna that comprises an end portion of the flexible printed circuit board, joined to the one of the essentially flat portions by an antenna joining portion.

Advantageously, the tyre sensor device may comprise contact terminals for interfacing the tyre sensor electronics assembly to an external terminal.

BRIEF DESCRIPTION OF THE DRAWINGS

These and other features and advantages of the present invention will be made evident by the following description of some exemplary and non-limitative embodiments thereof, to be read in conjunction with the attached drawings, wherein:

FIG. 1 shows a tyre sensor device according to an embodiment of the present invention, in perspective;

FIG. 2 shows the tyre sensor device of FIG. 1 in exploded view;

DETAILED DESCRIPTION OF EXEMPLARY EMBODIMENTS OF THE INVENTION

Figure 3:
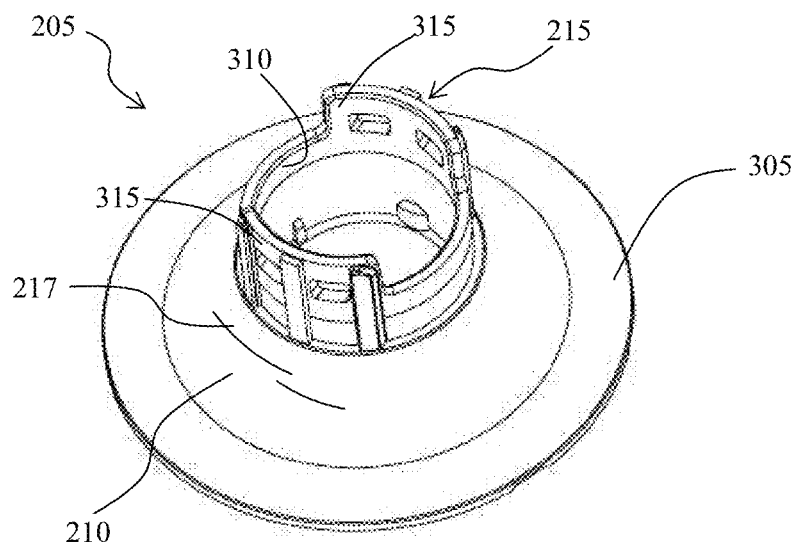
FIG. 3 shows a casing of the tyre sensor device of FIGS. 1 and 2, in perspective.

Making reference to the drawings, in FIG. 1 there is shown, in perspective, a tyre sensor device 100 according to an embodiment of the present invention. The tyre sensor device 100 is also shown in exploded view in FIG. 2. The tyre sensor device 100 comprises a casing 205 for accommodating tyre sensor device components, described later on in detail. The tyre sensor device casing 205 comprises a connecting part 210 and a base container 215. The connecting part 210 is generically circular in shape and is intended to be attached to an inner liner of a tyre (not shown in the drawings), so as to connect the tyre sensor device 100 to the tyre. The connecting part 210 is for example made of rubber. The connection between the sensor device 100 to the inner liner of the tyre may be for example accomplished by gluing.

The base container 215 is attached to the connecting part 210. The connecting part 210 has a circular collar 217 rising from a circular base of the connecting part 210, the circular collar 217 being hollow for receiving and accommodating therein at least a portion of the base container 215.

The base container 215 is generically cylindrical and hollow so as to define therein a cavity within which the tyre sensor device components are accommodated. As visible in FIG. 2, the tyre sensor device components that are accommodated in the cavity of the base container 215 comprise: a bottom bumper 220 (optional); a power supply battery 225; an electronics assembly 230, enclosed within a housing 235, and a clip 240 for closing the base container 215, so as to keep the tyre sensor device components within the base container 215.

Figure 4:
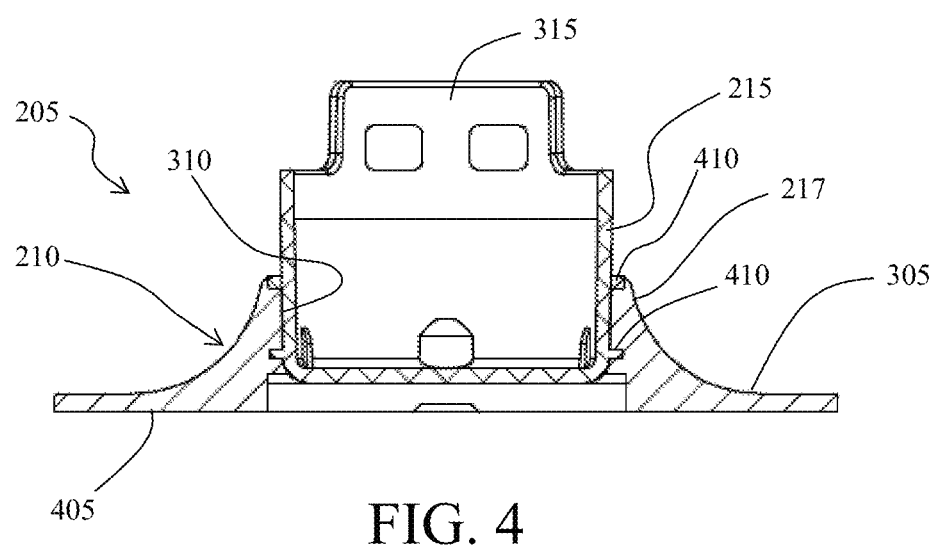
FIG. 4 shows a cross section of the tyre sensor device casing of FIG. 3 along a median vertical plane.

FIGS. 3 and 4 show the tyre sensor device casing 205 alone (i.e., with the connecting part 210 and the base container 215, but without the other components shown in FIG. 2) in perspective (FIG. 3) and in cross section along a median vertical plane (FIG. 4).

The connecting part 210 has a generically circular base flange 305 having a first diameter, and, on an opposite side with respect to a base flange side 405 that in use abuts the tyre inner liner, the connecting part 210 restricts and rises (preferably, in a rounded and smooth manner) to form the circular collar 217 which is hollow to form a generically cylindrical seat 310 for receiving the base container 215.

The base container 215 has a portion that is received within the seat 310 of the connecting part 210. The portion of the base container 215 that is received within the seat 310 preferably has, e.g. two, projecting ribs 410, for example circumferential, for making the attachment of the base container 215 to the connecting part 210 firmer. The portion of the base container 215 that protrudes from the seat 310 has two diametrically opposite, arc-shaped projecting walls 315.

Figure 5:
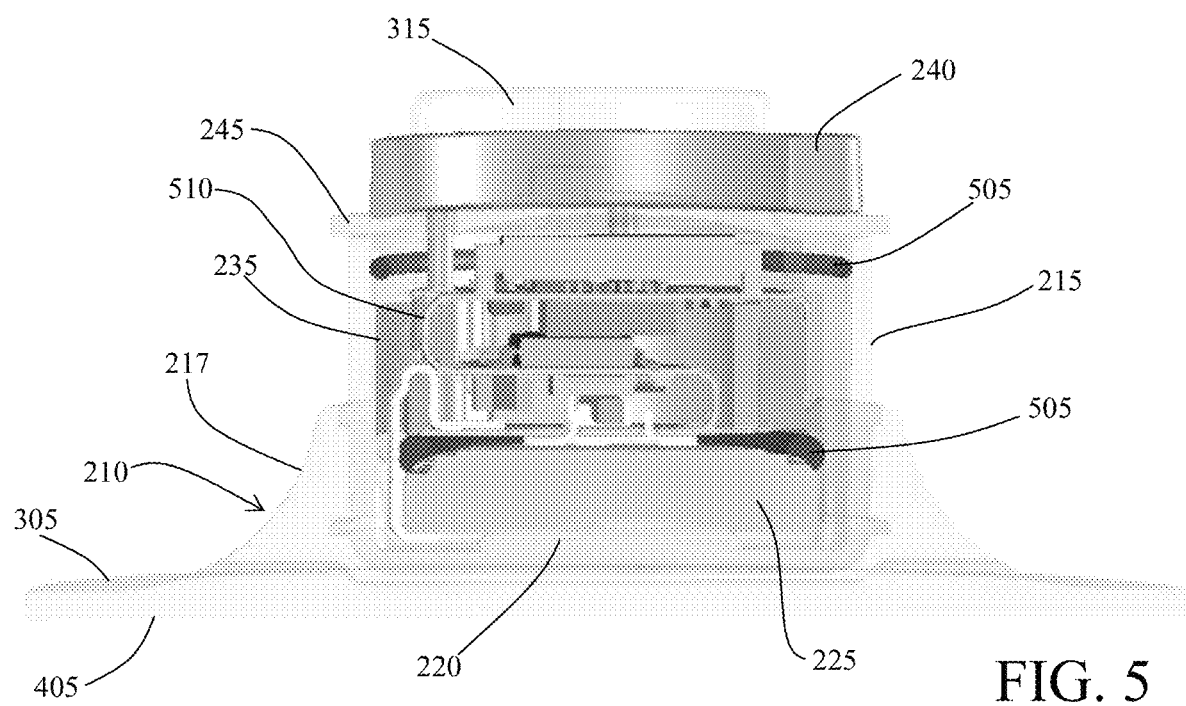
FIG. 5 shows a cross section of the tyre sensor device of FIG. 1 along a median vertical plane.

FIG. 5 shows a cross section along a vertical median plane similar to that of FIG. 4 of the tyre sensor device of FIG. 1, complete of all the components. The constitution of the electronics assembly 230 within the housing 235 is also visible, as well as two O-rings 505 advantageously provided below the electronics assembly 230 (more precisely, between the electronics assembly and the battery 225) and/or above it (more precisely, between the electronics assembly and the clip 240), to counteract possible misalignment and/or friction between the electronics assembly and the other components of the tyre sensor device.

Figure 6:
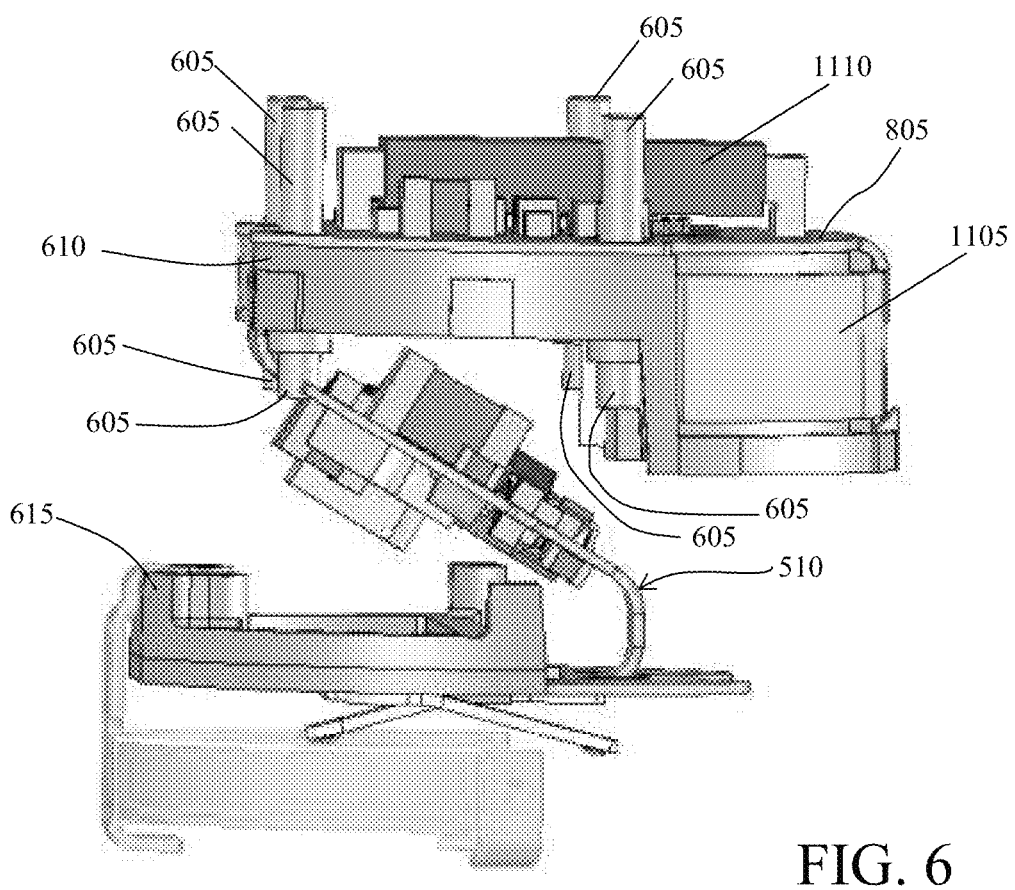
FIG. 6 is a lateral view of the tyre sensor device components accommodated within the tyre sensor device casing, with a partially folded flexible Printed Circuit Board (PCB) with tyre sensor device electronics to be accommodated inside the tyre sensor device casing.
Figure 11:
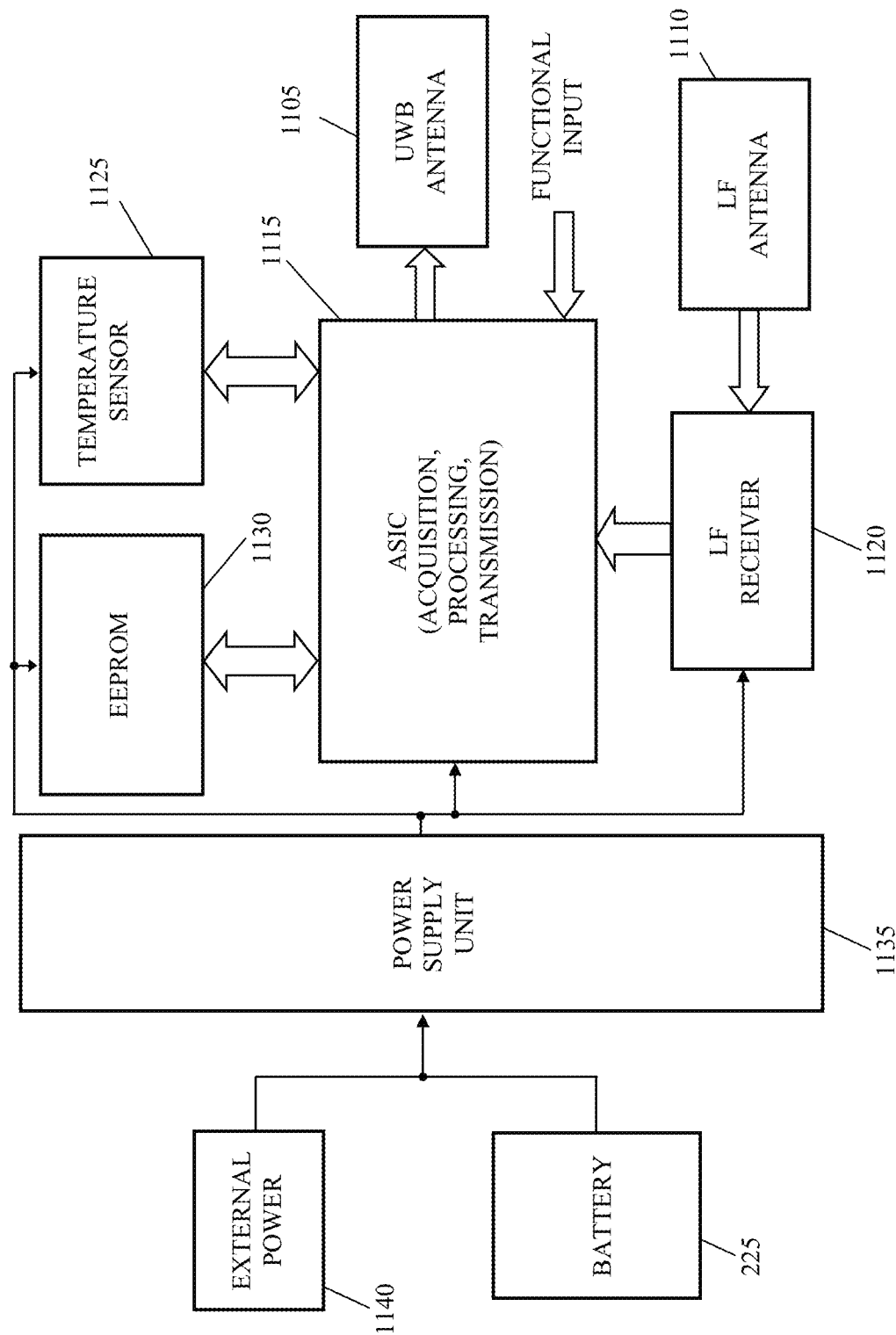
FIG. 11 is a schematic, functional block diagram of the tyre sensor electronics.

The electronics assembly 230 comprises a flexible Printed Circuit Board (PCB) 510, with electronic components mounted thereon. In FIG. 5 the flexible PCB 510 is in the flexed and folded condition, whereas in FIG. 6 the flexible PCB 510 is in a partially flexed, partially folded condition, while FIGS. 7, 8, 9 and 10 are, respectively, a top plan view, a side view, a bottom view and a front view of the flexible PCB 510 in an unflexed condition, with the components of the electronics assembly being better visible. FIG. 11 is a schematic, functional block diagram of the tyre sensor device electronics assembly 230.

Hereinafter, the electronics assembly 230 is described referring jointly to FIGS. 6 to 11.

The electronics assembly 230 comprises a transmitting antenna 1105 (e.g. a transmitting antenna adapted for Ultra Wide Band (UWB) transmission) for transmitting (uplink channel) to a receiver (not shown), e.g. a coordinator device for coordinating two or more tyre sensor devices installed on two or more tyres of a vehicle.

An antenna for a downlink channel may optionally be provided, i.e. for receiving from the coordinator device. For example, the receiving antenna can be a Low Frequency (LF) antenna 1110; as an alternative, the transmitting antenna 1105 might be exploited also as a receiving antenna.

The transmitting antenna is fed by a signal acquisition, processing and transmission unit 1115, e.g. an ASIC (Application Specific Integrated Circuit).

The receiving antenna 1110 feeds a receiver unit 1120 (e.g. an LF receiver unit), that in turn feeds the signal acquisition, processing and transmission unit 1115.

The receiver 1120 and the signal acquisition, processing and transmission unit 1115 are interfaced with one or more tyre sensor units 1125, adapted to sense at least one tyre parameter, comprising for example a temperature sensor, and/or an accelerometer sensor, and/or a pressure sensor, and with memory units 1130.

A power supply unit 1135 supplies power to the various units of the electronics assembly 230. The power is supplied either by the battery 225, or by an external power source 1140. The power from the external power source 1140 is for example received through contact terminals 605 in the form of pillars that, when the flexible PCB 510 is flexed and housed in the housing 235, extends vertically. The contact terminals 605 may also be also used for interfacing the electronics assembly 230 with an external equipment—not shown—e.g. for programming/re-programming the sensor.

The electronics assembly 230 can typically comprise further components, like resistors, capacitors, diodes, transistors, mounted to the flexible PCB 510. Such components are not described in detail since their provision and arrangement is routinary work for the average designer of electronics systems.

Figure 7:
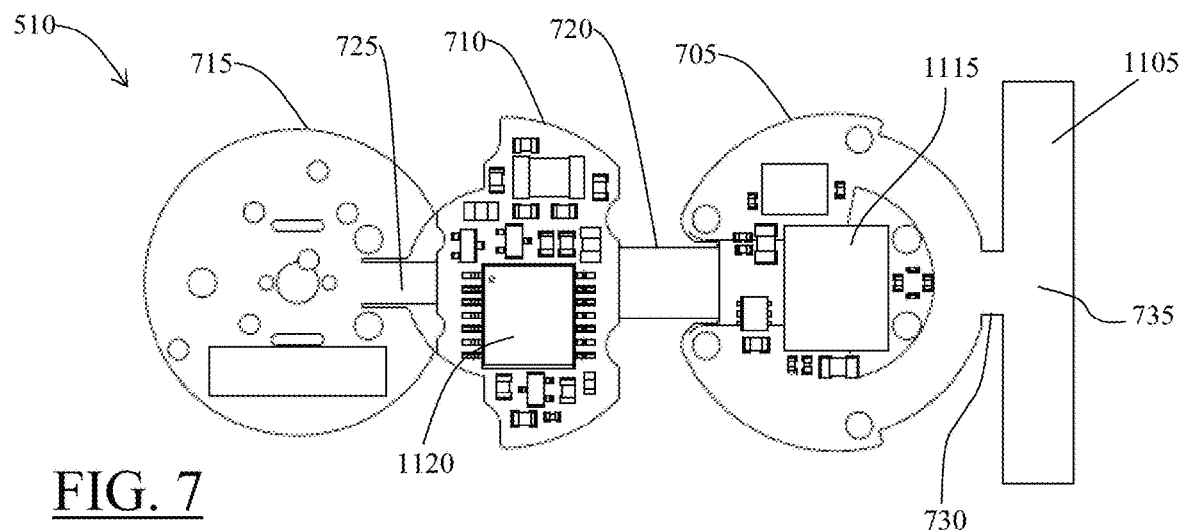
FIG. 7 is a top plan view of the flexible PCB, in unfolded condition.
Figure 8:
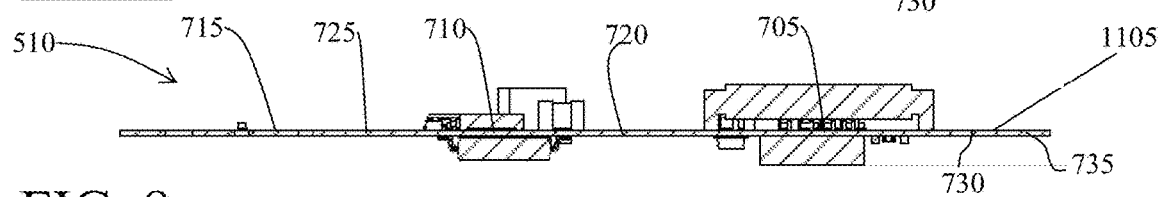
FIG. 8 is a side view of the flexible PCB of FIG. 7, in unfolded condition.
Figure 9:
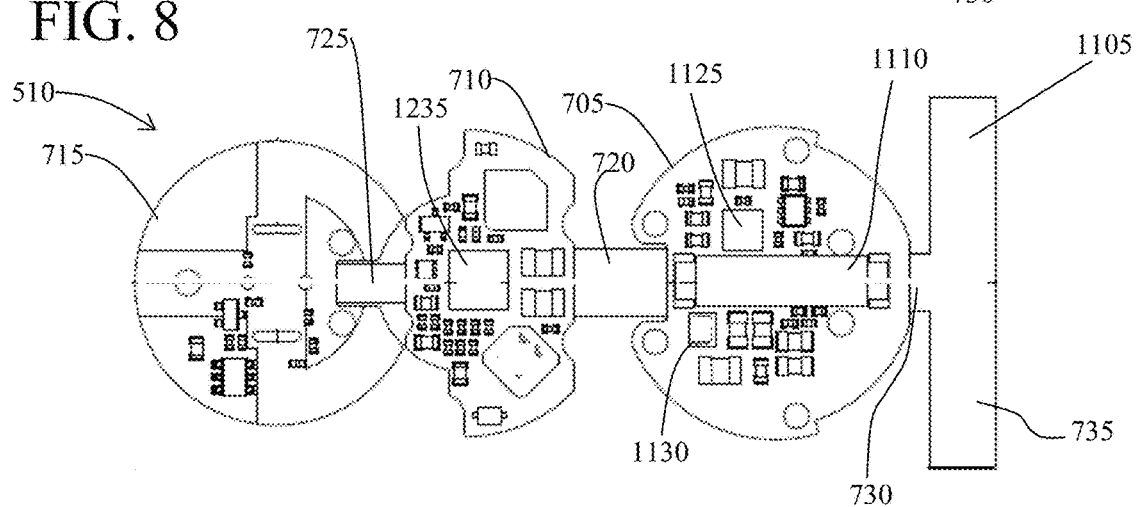
FIG. 9 is a bottom view of the flexible PCB of FIGS. 7 and 8, in unfolded condition.
Figure 10:
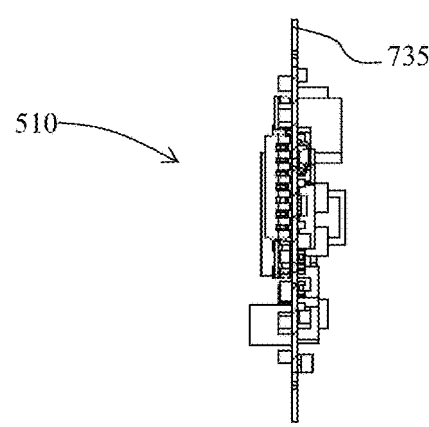
FIG. 10 is a front view of the flexible PCB of FIGS. 7 to 9, in unfolded condition.

The flexible PCB 510, as visible in FIGS. 7 to 9, comprises three main PCB portions 705, 710, 715, joined by joining PCB portions 720, 725. The main PCB portions 705, 710, 715 have a generically circular shape (other shapes being however possible; e.g., the shape of the main PCB portions may depend on the shape of the housing 235) and are larger than the joining PCB portions 720, 725, which for example are generically rectangular. The electronic components are mounted to the main PCB portions 705, 710, 715 of the flexible PCB, preferably on both sides thereof. The joining PCB portions 720, 725 ensure flexural mechanical connection between the main portions, as well as electrical connection among the electronic components. The transmitting antenna 1105 is for example a strip antenna, formed e.g. by screen printing on a generically rectangular end portion 735 of the flexible PCB 510, joined to the main PCB portion 705 by a joining portion 730. The end portion 735 where the transmitting antenna is formed is flexible as the rest of the PCB 510, so that it can be bent to take an arc shape, as visible in FIG. 6.

The housing 235 for the electronics assembly 230 comprises two parts 610 and 615 that are joinable to each other and which encase and support the flexible PCB 510, and a cap 245 that closes from above the housing 235. In particular, the part 610 (closer part) of the housing 235 is shaped so to have an arc-shaped shoulder that is used as a support for the end portion 735 of the flexible PCB 510, forming the transmitting antenna 1105. When joined to each other, the two parts 610 and 615 of the housing 235 form a solid and compact assembly which can be inserted within the base container 215, possibly after having been protected by the cap 245.

Under the end portion 735 a magnetic shield is preferably provided, for shielding the transmitting antenna 1105 from the remaining electronics.

The flexible PCB 510 is for example realized to have four layers in the main portions (three conductive layers for the signals and one conductive layer for the ground), and two layers (one conductive layer for the signals and one conductive layer for the ground) in the joining portions.

In particular, the flexible PCB 510 may be an assembly of multiple layers composed of:

polymide and adhesive for the non conductive layers;
copper for the internal conductive layers;
copper, nickel and gold for the external conductive layers.

Preferably, a solder mask is used to protect the PCB on the external layer.

The flexible PCB 510, with the electronic components mounted thereto, is folded, for example to an "S" or "Z" shape as mentioned in the foregoing, with the main PCB portions 705, 710, 715 (where the electronic components are mounted) which remain essentially planar when the flexible PCB 510 is folded, lying in three parallel planes. The capability to be folded is made possible by the flexibility of the joining PCB portions 720, 725, as well as by the flexible material making the PCB 510.

By providing a flexible PCB 510 that is foldable to an "S" or "Z" shape, up to six essentially flat PCB surface portions are made available for the placement of electronic components (the three main PCB portions 705, 710, 715, each having two sides). In other embodiments of the present invention, the flexible PCB 510 is folded to, e.g., a "C" shape (in which case, four essentially flat PCB surface portions are made available for the placement of electronic components), or to other, more complex shapes, making available more than six essentially flat PCB surface portions for the placement of electronic components.

When folded, the flexible PCB 510 is encased in the closer 235.

Some steps of an exemplary assembly procedure of the sensor node 100 are depicted in FIGS. 12A-12G.

Figure 12A:
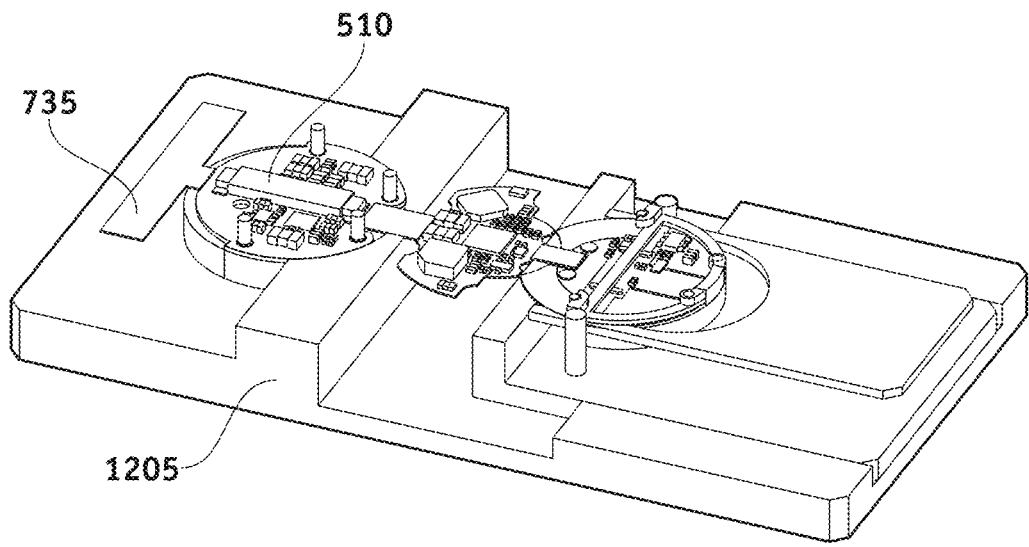
FIGS. 12A-12G show some steps of an exemplary assembly procedure of the tyre sensor device.
Figure 12B:
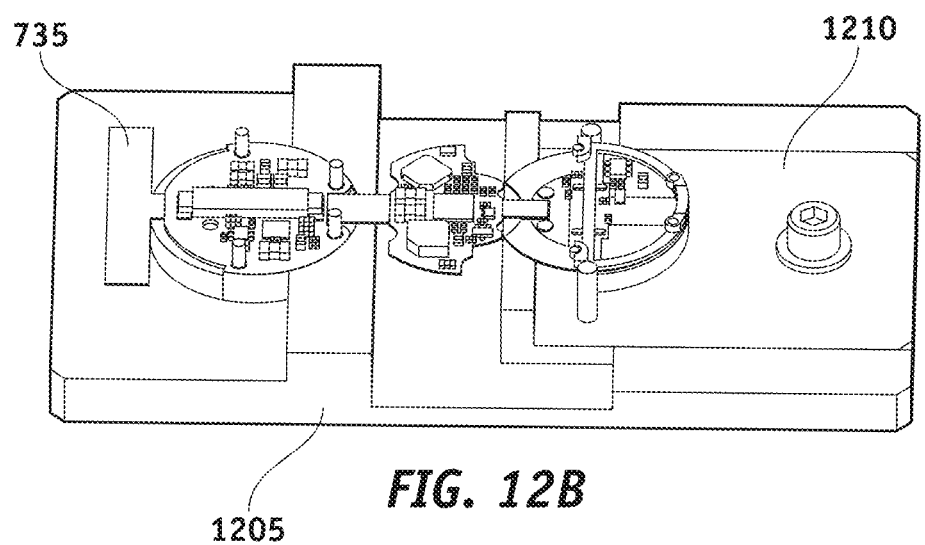

As shown in FIG. 12A, the flexible PCB 510 with the electronic components already mounted thereto is laid down, in un-flexed condition, on an assembling tool 1205 that is suitably shaped to receive the flexible PCB 510. The assembling tool 1205 comprises a holding plate 1210 that, after the flexible PCB 510 is laid down in proper position on the mounting tool 1205, is screwed to the assembling tool 1205 for holding the flexible PCB 510 in position during the subsequent operations (FIG. 12B).

Figure 12C:
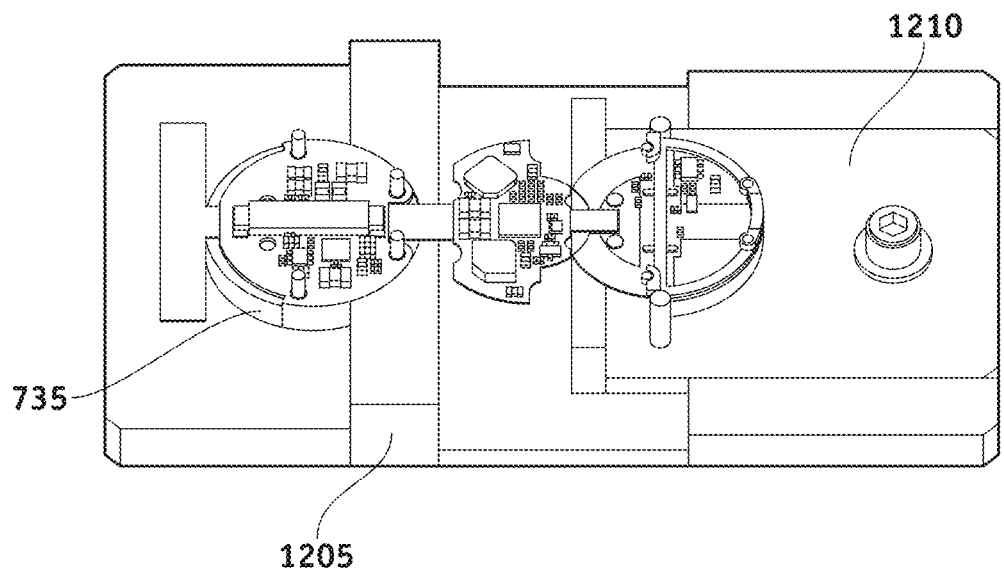

Then, the end portion 735 of the flexible PCB 510 that forms the transmitting antenna 1105 is then bent to take an arc shape (FIG. 12C).

The flexible PCB 510 is then removed from the mounting tool 1205.

Figure 12D:
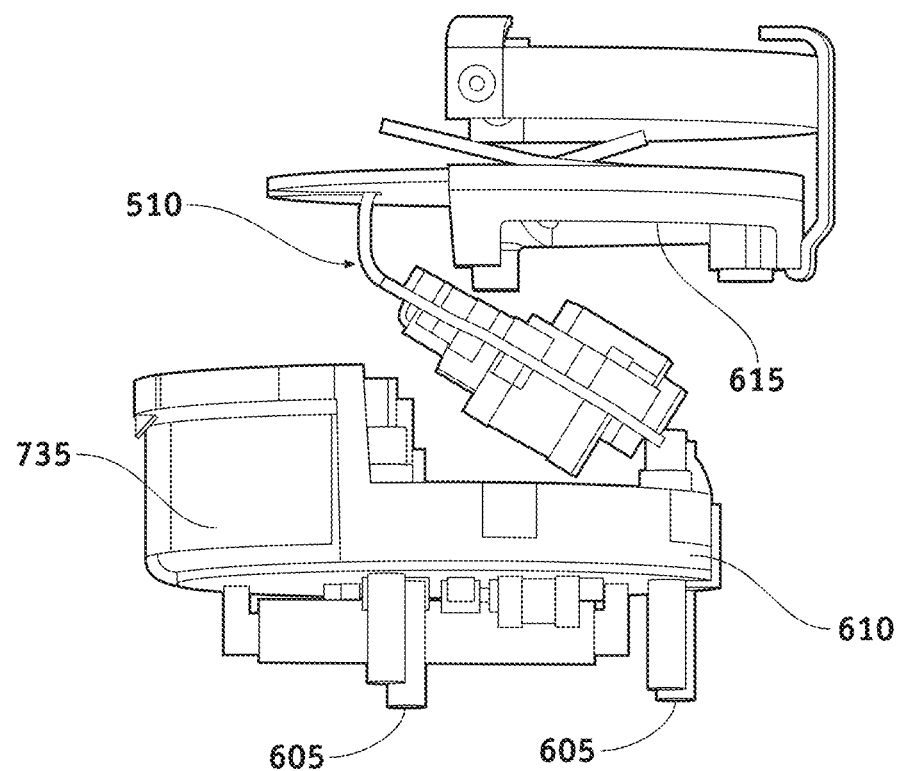
Figure 12E:
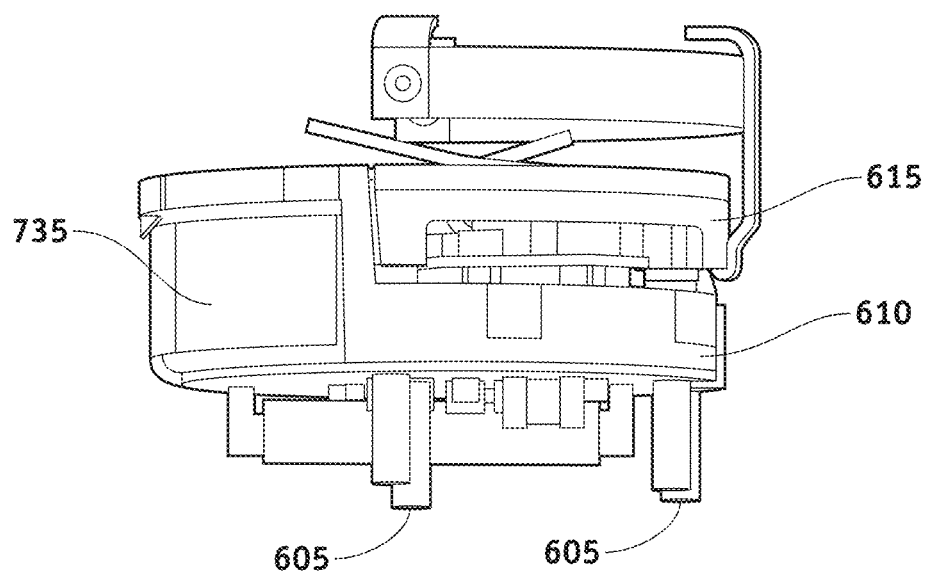
Figure 12F:
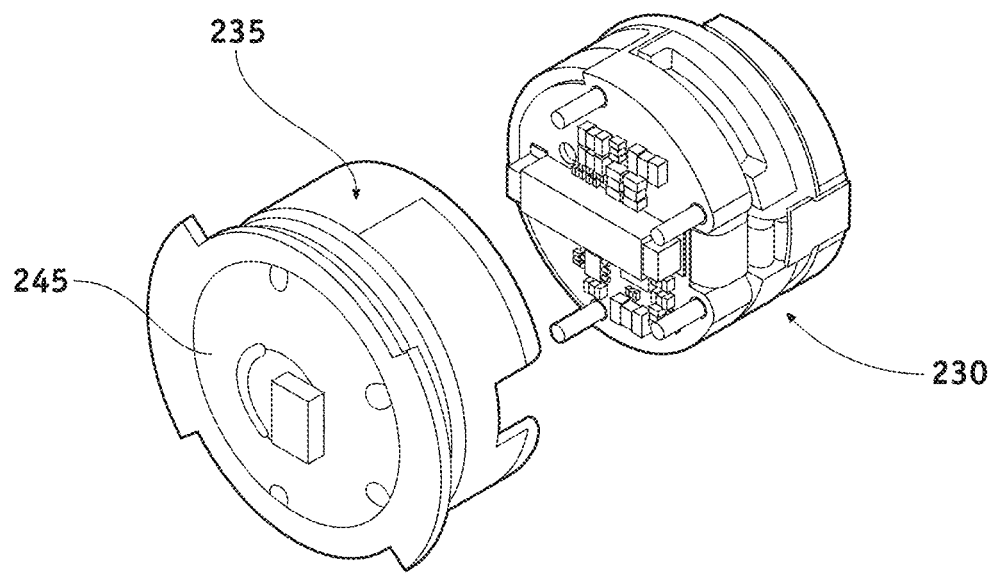
Figure 12G:
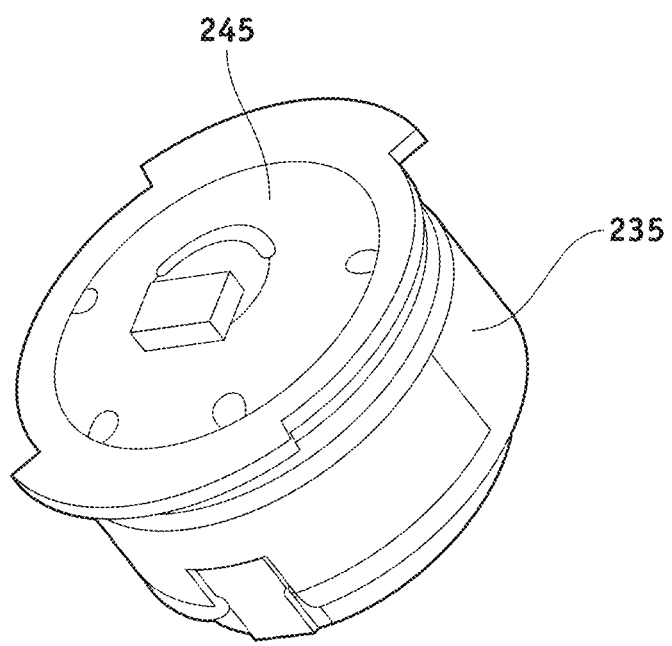

The flexible PCB 510 is bent, as in FIG. 12D, to the compact configuration shown in FIG. 12E.

Finally, the bent PCB is inserted into the housing 235 closed by the cap 245 (FIG. 12F), and the assembly is preferably potted.

Thanks to the present invention, a small but complex sensor device can be built: For example, the sensor device can include more than 100 SMD (Surface Mount Device)

components plus 2 plastic tube, 4 contact pins and 2 battery contacts, all embedded in a housing 235 having a diameter lower than 2 cm and a thickness of about 1-1.5 cm.

The invention claimed is:

1. A tyre sensor device comprising
a container having a container housing, and
a tyre sensor device electronics assembly,
the tyre sensor device electronics assembly comprising:
a foldable flexible printed circuit board comprising at least two printed circuit board portions each having two surfaces,
the at least two printed circuit board portions being suitable for placement, on at least one surface thereof, of electronic components of the tyre sensor device,
the electronic components comprising at least one sensor for sensing at least one tyre parameter,
the foldable flexible printed circuit board being configured to be folded for insertion of the tyre sensor device electronics assembly in the container housing, the container housing being adapted to contain the foldable printed circuit board in a folded condition.

2. The tyre sensor device of claim 1, further comprising a connecting element for connecting the tyre sensor device to a vehicle tyre.

3. The tyre sensor device of claim 2, wherein the connecting element comprises a rubber housing adapted to be attached to an inner liner of the tyre.

4. The tyre sensor device of claim 3, wherein the rubber housing has a seat for receiving said container.

5. The tyre sensor device according to claim 1, wherein the container housing comprises a first container housing part and a second container housing part joinable to each other.

6. The tyre sensor device according to claim 1, wherein the foldable flexible printed circuit board is foldable to a generic "S" or "Z" shape and, when folded, comprises three essentially planar portions suitable for the placement, on at least one surface thereof, of electronic components of the tyre sensor device.

7. The tyre sensor device according to claim 6, wherein the foldable flexible printed circuit board comprises two joining portions for joining the three essentially planar portions.

8. The tyre sensor device according to claim 7, wherein
the three essentially planar portions comprise three conductive layers for signal conduction and one conductive layer for a reference potential, and
the joining portions comprise one conductive layer for signal conduction and one conductive layer for a reference potential.

9. The tyre sensor device according to claim 1, further comprising contact terminals for interfacing the tyre sensor electronics assembly to an external terminal.

10. A vehicle tyre comprising
an inner liner and
the tyre sensor device of claim 1 connected to the inner liner.

* * * * *